(12) United States Patent
Jung et al.

(10) Patent No.: US 11,483,935 B2
(45) Date of Patent: Oct. 25, 2022

(54) PCB STRUCTURE AND ELECTRONIC DEVICE INCLUDING THE SAME

(71) Applicant: SAMSUNG ELECTRONICS CO., LTD., Suwon-si (KR)

(72) Inventors: Hwajoong Jung, Suwon-si (KR); Manho Kim, Suwon-si (KR); Taehwan Kim, Suwon-si (KR); Kihuk Lee, Suwon-si (KR); Yonghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/172,338

(22) Filed: Feb. 10, 2021

(65) Prior Publication Data

US 2021/0251083 A1  Aug. 12, 2021

(30) Foreign Application Priority Data

Feb. 10, 2020  (KR) .................. 10-2020-0015440

(51) Int. Cl.
*H05K 3/12* (2006.01)
*H05K 1/02* (2006.01)
(Continued)

(52) U.S. Cl.
CPC ......... *H05K 3/1283* (2013.01); *H05K 1/0274* (2013.01); *H05K 1/181* (2013.01);
(Continued)

(58) Field of Classification Search
CPC .................................................. H05K 3/1283
(Continued)

(56) References Cited

U.S. PATENT DOCUMENTS

| 10,153,235 B2 | 12/2018 | Jung et al. |
| 10,194,066 B2 | 1/2019 | Jung et al. |

(Continued)

FOREIGN PATENT DOCUMENTS

| JP | 2010-220245 A | 9/2010 |
| JP | 2017-060037 A | 3/2017 |

(Continued)

OTHER PUBLICATIONS

PCT International Search Report dated Jun. 7, 2021 for PCT/KR2021/001788 (3pgs).

*Primary Examiner* — Stanley Tso
(74) *Attorney, Agent, or Firm* — Nixon & Vanderhye P.C.

(57) ABSTRACT

An electronic device includes: a housing and a printed circuit board (PCB) structure disposed in the housing. The PCB structure includes a circuit board including an opening area formed through a first surface of the circuit board and a second surface of the circuit board opposite the first surface and a conductive pattern formed in a peripheral area around the opening area, a plate disposed on the second surface of the circuit board covering the opening area, an electronic element disposed on the plate and electrically connected with the circuit board, a resin portion disposed between the plate and the circuit board and extending from the conductive pattern, the resin portion including a conductive material, and a solder portion formed between the resin portion and the plate.

17 Claims, 9 Drawing Sheets

(51) Int. Cl.
*H05K 1/18* (2006.01)
*H05K 3/30* (2006.01)

(52) U.S. Cl.
CPC ........... *H05K 3/301* (2013.01); *H05K 1/0271* (2013.01); *H05K 2203/0405* (2013.01); *H05K 2203/10* (2013.01)

(58) Field of Classification Search
USPC ........................................................ 174/257
See application file for complete search history.

(56) References Cited

U.S. PATENT DOCUMENTS

| | | | |
|---|---|---|---|
| 10,257,332 | B2 | 4/2019 | Kim et al. |
| 10,820,457 | B1 * | 10/2020 | Kishi ................. B32B 27/26 |
| 2004/0047136 | A1 * | 3/2004 | Takenaka ............ H05K 3/4092 |
| | | | 361/777 |
| 2016/0242289 | A1 | 8/2016 | Kim et al. |
| 2018/0130750 | A1 | 5/2018 | Jung et al. |
| 2019/0028622 | A1 * | 1/2019 | Hu ...................... H04N 5/2257 |
| 2019/0149707 | A1 | 5/2019 | Jung et al. |
| 2019/0295910 | A1 * | 9/2019 | Horiuchi ............... H01L 31/024 |

FOREIGN PATENT DOCUMENTS

| | | |
|---|---|---|
| JP | 2018-088555 A | 6/2018 |
| KR | 101142347 B1 | 7/2012 |
| KR | 2019-0019729 A | 2/2019 |

* cited by examiner

PCB STRUCTURE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2020-0015440, filed on Feb. 10, 2020, in the Korean Intellectual Property Office, the disclosure of which is incorporated by reference herein its entirety.

BACKGROUND

1. Field

The disclosure relates to a PCB structure and an electronic device including the same.

2. Description of Related Art

An electronic device may include a circuit board. A plurality of electric (e.g., electronic) elements may be disposed on the circuit board, and the circuit board may include a conductive pattern that connects the plurality of electric elements. The plurality of electric elements may be electrically connected with the conductive pattern through various means.

The electric elements may be mounted on the circuit board using surface mounting technology (SMT). The surface mounting technology may include soldering the electric elements to partial areas (e.g., pads) of the conductive pattern included in the circuit board.

The circuit board may include pads formed by exposing the conductive pattern. The electric elements may be mounted on the circuit board by being soldered to the pads. In order to mount relatively large mechanical parts, wide pads may be required, which makes it difficult to efficiently use the circuit board.

An image sensor may be disposed on a circuit board included in a camera module. For the flatness of the image sensor, it is preferable that pressure is not applied to the circuit board in a process of mounting the image sensor.

The above information is presented as background information only to assist with an understanding of the disclosure. No determination has been made, and no assertion is made, as to whether any of the above might be applicable as prior art with regard to the disclosure.

SUMMARY

Embodiments of the disclosure address at least the above-mentioned problems and/or disadvantages and to provide at least the advantages described below. Accordingly, embodiments of the disclosure provide a printed circuit board (PCB) structure for mounting a wide mechanical part on a relatively small pad.

Embodiments of the disclosure provide a plate having a degree of flatness appropriate for an image sensor and a PCB structure for mounting the plate on a circuit board.

In accordance with an example embodiment of the disclosure, an electronic device includes: a housing and a PCB structure disposed in the housing. The PCB structure includes a circuit board including an opening area formed through a first surface and a second surface, the first surface being opposite the second surface, and a conductive pattern formed in a peripheral area around the opening area, a plate disposed on the second surface of the circuit board and covering the opening area, an electronic element disposed on the plate and electrically connected with the circuit board, a resin portion disposed between the plate and the circuit board extending from the conductive pattern and including a conductive material, and a solder portion formed between the resin portion and the plate.

In accordance with another example embodiment of the disclosure, an electronic device includes: a housing, a display that forms a first surface of the housing, a circuit board disposed in the housing and including a conductive pattern and an insulation layer covering part of the conductive pattern and forming a surface of the circuit board, the circuit board having an opening through which a first portion of the conductive pattern is exposed on the surface of the circuit board, a metal plate disposed on the circuit board and electrically connected with the first portion of the conductive pattern, an electronic element disposed on the metal plate, a conductive resin electrically connecting the electronic element and the conductive pattern, and a solder portion electrically connecting the metal plate and the conductive resin. At least part of the conductive resin is accommodated in the opening, and another part of the conductive resin extends along a surface of the insulation layer.

Other aspects, advantages, and salient features of the disclosure will be apparent to those skilled in the art from the following detailed description, which, taken in conjunction with the annexed drawings, discloses various example embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

In the following description made with respect to the accompanying drawings, similar components will be assigned with similar reference numerals.

DETAILED DESCRIPTION

Figure 1:
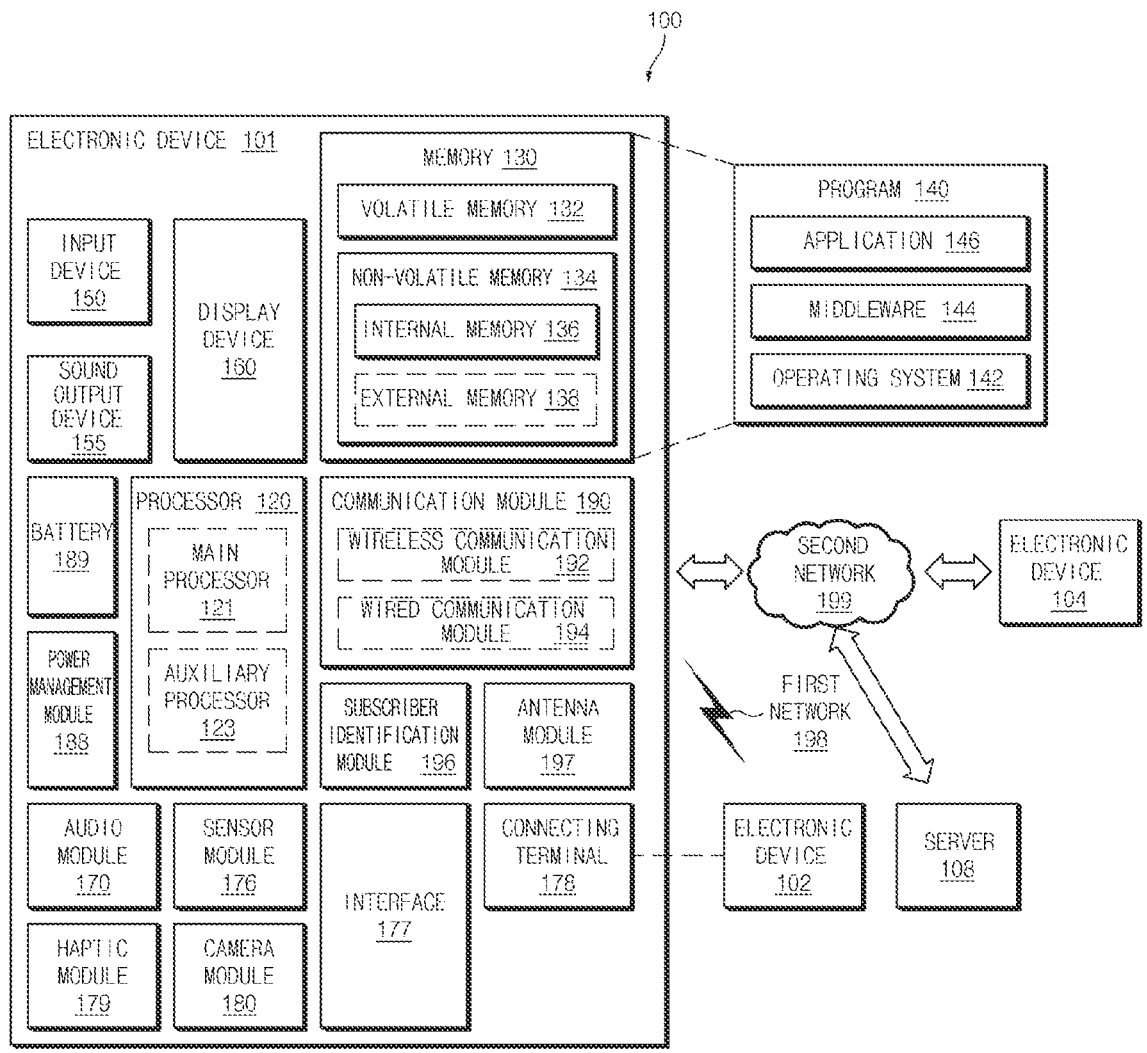
FIG. 1 is a block diagram illustrating an example electronic device in a network environment 100 according to various embodiments.

Hereinafter, various example embodiments of the disclosure may be described with reference to accompanying drawings. Accordingly, those of ordinary skill in the art will recognize that various modifications, equivalents, and/or alternatives on the various example embodiments described herein can be variously made without departing from the scope and spirit of the disclosure. With regard to description of drawings, similar components may be marked by similar reference numerals.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, a key (e.g., a button), or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102) (e.g., speaker of headphone) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, when the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
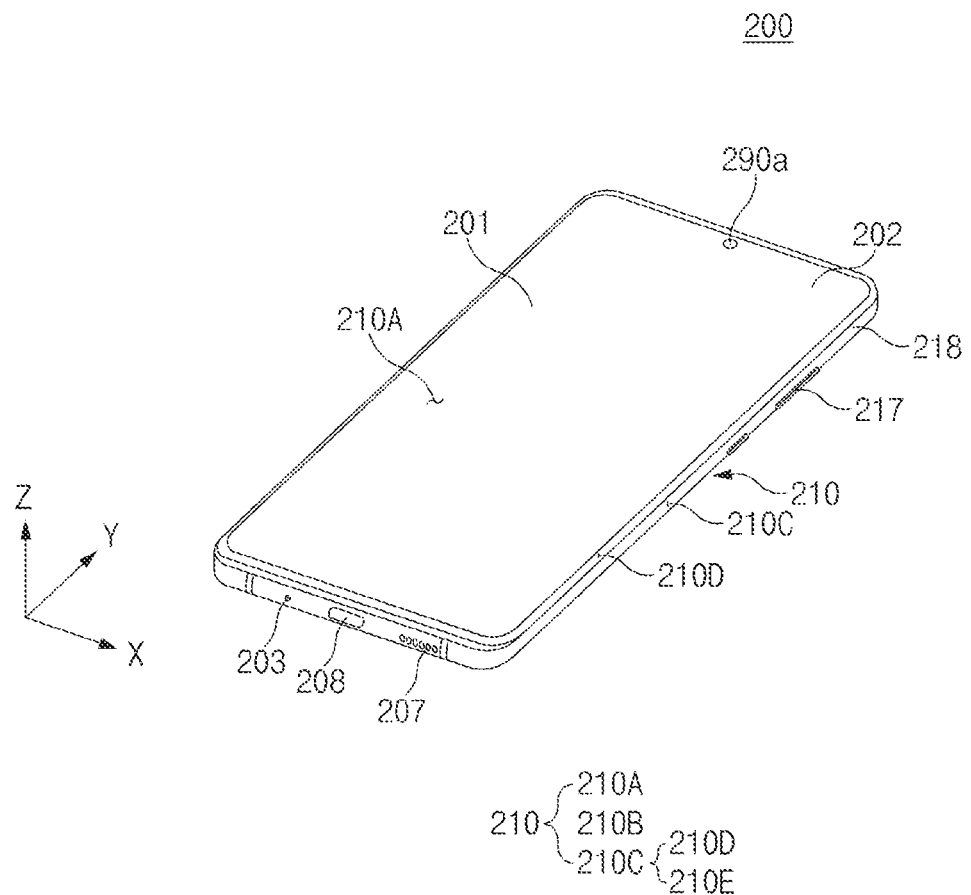
FIG. 2A is a front perspective view of an electronic device according to various embodiments.
Figure 2B:
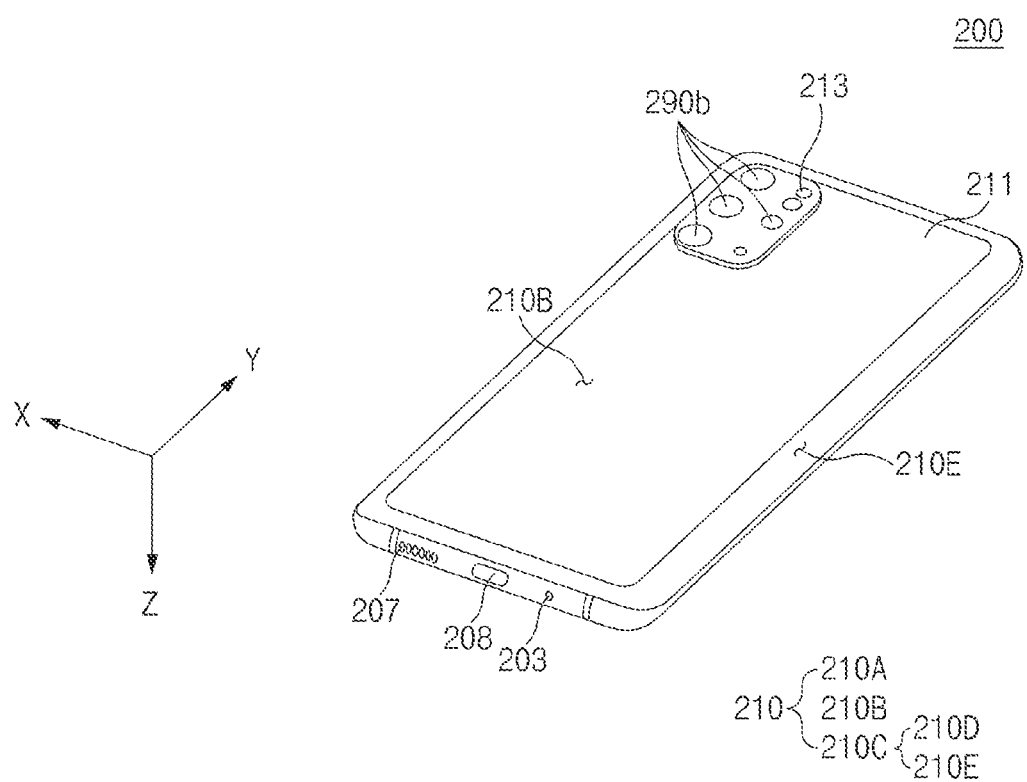
FIG. 2B is a rear perspective view of the electronic device according to various embodiments.

FIG. 2A is a front perspective view of an electronic device according to various embodiments. FIG. 2B is a rear perspective view of the electronic device according to various embodiments.

Referring to FIGS. 2A and 2B, the electronic device 200 according to an embodiment may include a housing 210 that includes a first surface (or, a front surface) 210A, a second surface (or, a rear surface) 210B, and side surfaces 210C surrounding a space between the first surface 210A and the second surface 210B.

In an embodiment (not illustrated), the housing 210 may refer to a structure that forms some of the first surface 210A, the second surface 210B, and the side surfaces 210C of FIGS. 2A and 2B.

According to an embodiment, the first surface 210A may be formed by a front plate 202, at least part of which is substantially transparent (e.g., a glass plate including various coating layers, or a polymer plate). The second surface 210B may be formed by a back plate 211 that is substantially opaque. The back plate 211 may be formed of, for example, coated or colored glass, ceramic, polymer, metal (e.g., aluminum, stainless steel (STS), or magnesium), or a combination of at least two of the aforementioned materials. The side surfaces 210C may be formed by a side bezel structure (or, a "frame structure") 218 that is coupled with the front plate 202 and the back plate 211 and that contains metal and/or polymer.

In various embodiments, the back plate 211 and the side bezel structure 218 may be integrally formed with each other and may contain the same material (e.g., a metallic material such as aluminum).

In the illustrated embodiment, the front plate 202 may include, at opposite long edges thereof, two first areas 210D that curvedly and seamlessly extend from the first surface 210A toward the back plate 211.

In the illustrated embodiment, the back plate 211 may include, at opposite long edges thereof, two second areas 210E that curvedly and seamlessly extend from the second surface 210B toward the front plate 202.

In various embodiments, the front plate 202 (or, the back plate 211) may include only one of the first areas 210D (or, the second areas 210E). In an embodiment, the front plate 202 (or, the back plate 211) may not include a part of the first areas 210D (or, the second areas 210E).

In the embodiments, when viewed from a side of the electronic device 200, the side bezel structure 218 may have a first thickness (or, width) at sides (e.g., short sides) not including the first areas 210D or the second areas 210E and may have a second thickness at sides (e.g., long sides) including the first areas 210D or the second areas 210E, the second thickness being smaller than the first thickness.

According to an embodiment, the electronic device 200 may include at least one of a display 201, audio modules 203 and 207 (e.g., the audio module 170 of FIG. 1), a sensor module (not illustrated) (e.g., the sensor module 176 of FIG. 1), camera modules 290a, 290b, and 213 (e.g., the camera module 180 of FIG. 1), key input devices 217 (e.g., the input device 150 of FIG. 1), or a connector hole 208 (e.g., the connecting terminal 178 of FIG. 1). In various embodiments, the electronic device 200 may not include at least one component (e.g., the key input devices 217) among the aforementioned components, or may further include other component(s) (e.g., a light emitting element (not illustrated)).

The display 201, for example, may be exposed through most of the front plate 202. In various embodiments, at least part of the display 201 may be exposed through the front plate 202 that includes the first surface 210A and the first areas 210D of the side surfaces 210C.

In various embodiments, the periphery of the display 201 may be formed to be substantially the same as the shape of the adjacent outside edge of the front plate 202. In an embodiment (not illustrated), to expand the area by which the display 201 is exposed, the gap between the outside edge of the display 201 and the outside edge of the front plate 202 may be formed to be substantially constant.

In an embodiment, a surface of the housing 210 (or, the front plate 202) may include a screen display area that is formed as the display 201 is visually exposed (e.g., viewable or visible). For example, the screen display area may include the first surface 210A and the first areas 210D of the side surfaces 210C.

In various embodiments, the screen display area 210A and 210D may include a sensing area (not illustrated) that is configured to obtain biometric information of a user. For example, the sensing area may refer to an area capable of displaying visual information of the display 201 like the other areas of the screen display area 210A and 210D and additionally obtaining the user's biometric information (e.g., fingerprint).

In an embodiment, the screen display area 210A and 210D of the display 201 may include an area through which the first camera module 290a (e.g., a punch hole camera) is visually exposed (e.g., visible). For example, the area through which the first camera module 290a is exposed may be surrounded by the screen display area 210A and 210D. In various embodiments, the first camera module 290a may include a plurality of camera modules (e.g., the camera module 180 of FIG. 1).

In an embodiment (not illustrated), the display 201 may be coupled with, or disposed adjacent to, touch detection circuitry, a pressure sensor for measuring the intensity (pressure) of a touch, and/or a digitizer for detecting a stylus pen of a magnetic type.

In various embodiments, at least a part of the key input devices 217 may be disposed on the side surfaces 210C (e.g., the first areas 210D and/or the second areas 210E).

The audio modules 203 and 207 may include the microphone hole 203 and the speaker hole 207. A microphone for obtaining a sound from the outside may be disposed in the microphone hole 203, and in various embodiments, a plurality of microphones may be disposed in the microphone hole 203 to detect the direction of a sound. The speaker hole 207 may include an external speaker hole 207 and a receiver hole (not illustrated) for a telephone call. In various embodiments, the speaker hole 207 and the microphone hole 203 may be implemented with a single hole, or a speaker (e.g., a piezo speaker) may be included without the speaker hole 207.

The sensor module (not illustrated) (e.g., the sensor module 176 of FIG. 1) may generate an electrical signal or a data value that corresponds to an operational state inside the electronic device 200 or an environmental state external to the electronic device 200. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

The camera modules 290a, 290b, and 213 may include the first camera module 290a (e.g., a punch hole camera) visible on the first surface 210A of the electronic device 200, and the second camera module 290b and/or the flash 213 exposed on the second surface 210B of the electronic device 200.

In an embodiment, the first camera module 290a may be visible through part of the screen display area 210A and 210D of the display 201. For example, the first camera module 290a may be visible on a partial area of the screen display area 201A and 210D through an opening (e.g., a punch hole) that is formed in part of the display 201.

In an embodiment, the second camera module 290b may include a plurality of camera modules (e.g., a dual camera, a triple camera, or a quad camera). However, the second camera module 290b is not necessarily limited to including the plurality of camera modules and may include one camera module.

The first camera module 290a and the second camera module 290b may include one or more lenses, an image sensor, and/or an image signal processor, but is not limited thereto. The flash 213 may include, for example, a light emitting diode or a xenon lamp. In various embodiments, two or more lenses (an IR camera lens, a wide angle lens, and a telephoto lens) and image sensors may be disposed on one surface of the electronic device 200.

The key input devices 217 may be disposed on the side surfaces 210C of the housing 210. In an embodiment, the electronic device 200 may not include all or some of the aforementioned key input devices 217, and the key input devices 217 not included may be implemented in a different form, such as a soft key, on the display 201. In various embodiments, the key input devices 217 may include a sensor module (not illustrated) that forms the sensing area (not illustrated) that is included in the screen display area 210A and 210D.

The connector hole 208 may include a first connector hole 208 in which a connector (e.g., a USB connector) for transmitting and receiving power and/or data with an external electronic device is accommodated, and/or a second connector hole (not illustrated) (e.g., an earphone jack) in which a connector for transmitting and receiving audio signals with an external electronic device is accommodated.

In various embodiments, the electronic device 200 may include a light emitting element (not illustrated). The light emitting element, for example, may be disposed on the first surface 210A of the housing 210. The light emitting element, for example, may provide state information of the electronic device 200 in the form of light. In an embodiment, the light emitting element may provide, for example, a light source that operates in conjunction with the first camera module 290a. The light emitting element may include, for example, an LED, an IR LED, and/or a xenon lamp.

Figure 2C:
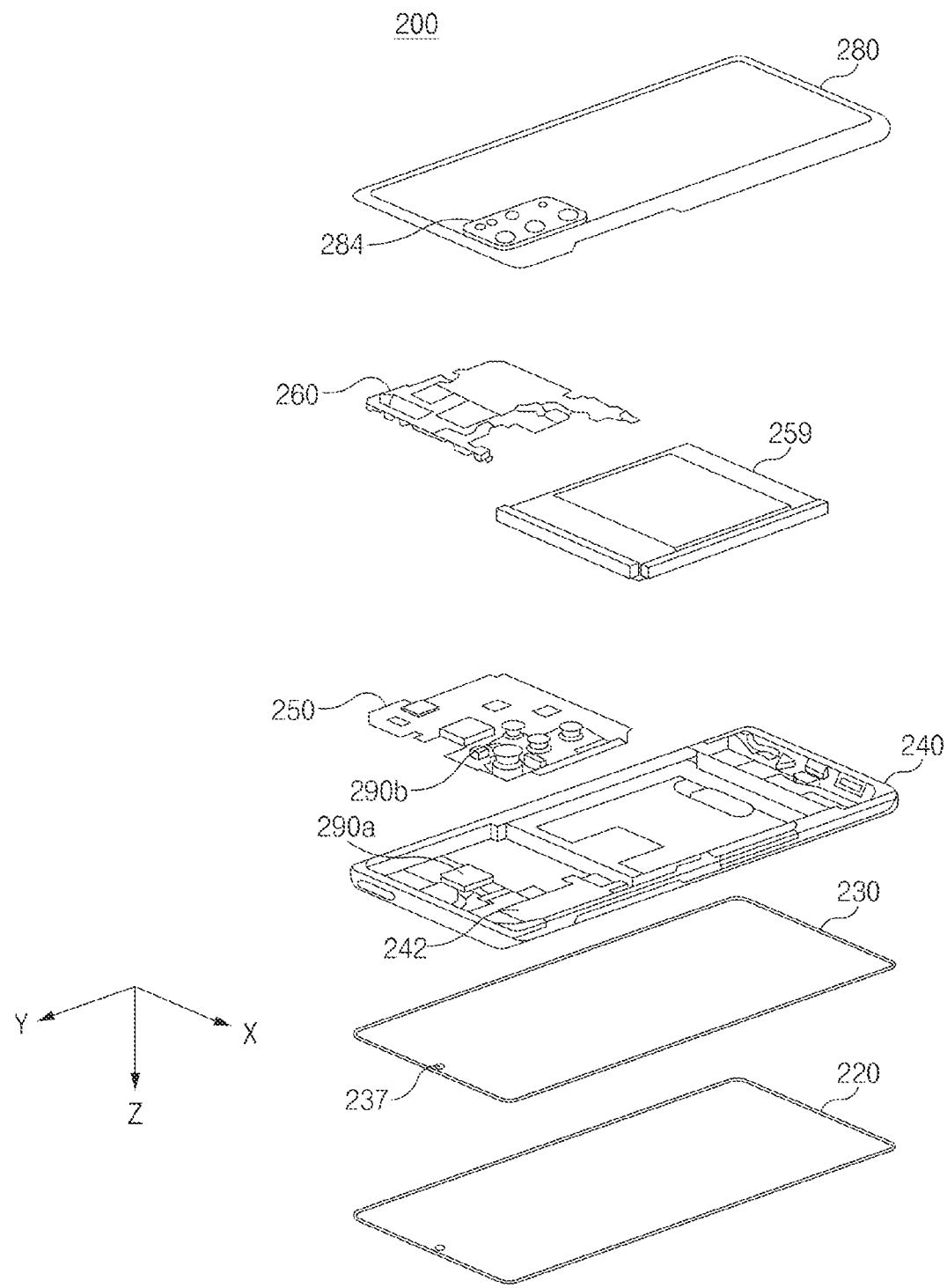
FIG. 2C is an exploded perspective view of the electronic device according to various embodiments.

FIG. 2C is an exploded perspective view of the electronic device according to various embodiments.

Referring to FIG. 2C, the electronic device 200 may include a front plate 220 (e.g., the front surface 210A and the first areas 210D of FIG. 2A), a display 230 (e.g., the display 201 of FIG. 2A), a side member 240 (e.g., a part of the side surfaces 210C of FIG. 2A, e.g., including a frame or bezel structure), a first support member 242 (e.g., a plate structure), a circuit board 250, a battery 259, a second support member 260, and a back plate 280 (e.g., the rear surface 210B and the second areas 210E of FIG. 2B).

In various embodiments, the electronic device 200 may not include at least one component (e.g., the first support member 242 or the second support member 260) among the aforementioned components, or may additionally include other component(s). At least one of the components of the electronic device 200 may be the same as, or similar to, at least one of the components of the electronic device 200 of FIGS. 2A and 2B, and repetitive descriptions will may not be repeated.

The first support member 242 may be disposed in the electronic device 200 and may be connected with the side member 240, or may be integrally formed with the side member 240. The first support member 242 may be formed of, for example, a metallic material and/or a nonmetallic (e.g., polymer) material. The display 230 may be coupled to one surface of the first support member 242, and the circuit board 250 may be coupled to an opposite surface of the first support member 242. The circuit board 250 may have, for example, and without limitation a processor, a memory, and/or an interface mounted (e.g., an electronic element or device) thereon. The processor may include, for example, one or more of a central processing unit, an application processor, a graphic processing unit, an image signal processor, a sensor hub processor, a communication processor, or the like, but is not limited thereto.

The memory may include, for example, a volatile memory or a nonvolatile memory.

The interface may include various interface circuitry, for example, a high definition multimedia interface (HDMI), a universal serial bus (USB) interface, an SD card interface, and/or an audio interface. The interface, for example, may electrically or physically connect the electronic device 200 with an external electronic device and may include a USB connector, an SD card/MMC connector, or an audio connector.

The battery 259, which may refer, for example, to a device for supplying electric power to at least one component of the electronic device 200, may include, for example, a primary cell that is not rechargeable, a secondary cell that is rechargeable, or a fuel cell. At least part of the battery 259, for example, may be disposed on substantially the same plane as the circuit board 250. The battery 259 may be integrally disposed inside the electronic device 200, or may be disposed so as to be detachable from the electronic device 200.

In various embodiments, the first camera module 290a may be disposed on the first support member 242 of the side member 240 such that a lens is visible through a partial area of the front plate 220 (e.g., the front surface 210A of FIG. 2A) of the electronic device 200. For example, the first camera module 290a may be disposed such that the optical axis of the lens is at least partially aligned with a hole or recess 237 formed in the display 230. For example, the area through which the lens is exposed may be formed in the front plate 220. For example, the first camera module 290a may include a punch hole camera disposed in the hole or recess 237 formed in a rear surface of the display 230.

In various embodiments, the second camera module 290b may be disposed on the circuit board 250 such that a lens is visible through a camera area 284 of the back plate 280 (e.g., the rear surface 210B of FIG. 2B) of the electronic device 200.

In the illustrated embodiment, the camera area 284 may be formed on a surface (e.g., the rear surface 210B of FIG. 2B) of the back plate 280. In various embodiments, the camera area 284 may be formed to be at least partially transparent such that external light is incident on the lens of the second camera module 290b. In various embodiments, at least part of the camera area 284 may protrude to a predetermined height from the surface of the back plate 280. However, the camera area 284 is not limited thereto, and in various embodiments, the camera area 284 may form substantially the same plane as the surface of the back plate 280.

In various embodiments, the front plate 220, the back plate 280, and at least part of the side member 240 may form a housing (e.g., the housing 210 of FIGS. 2A and 2B).

Figure 3A:
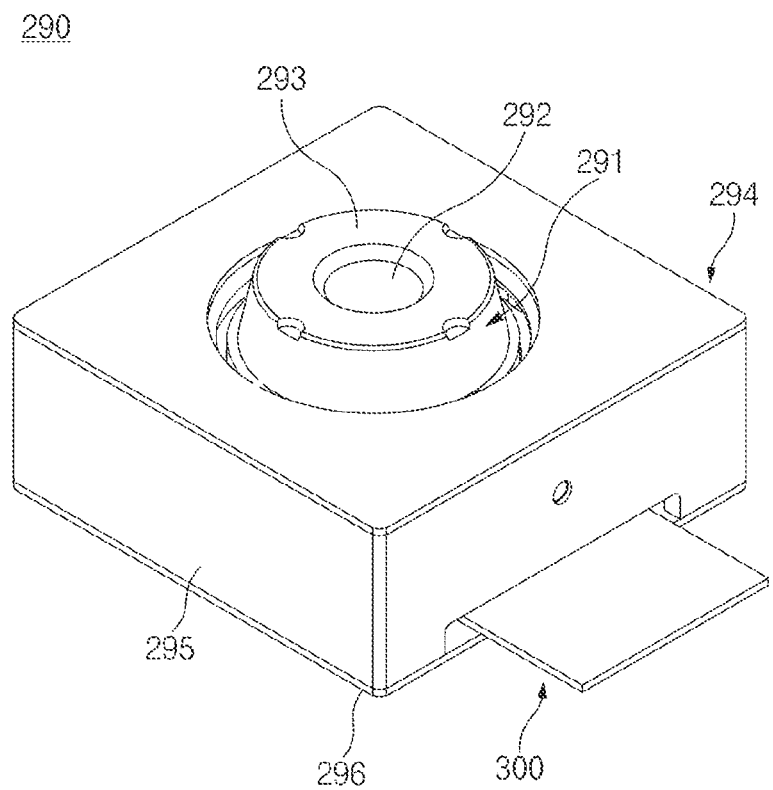
FIG. 3A is a perspective view illustrating an camera module of the electronic device according to various embodiments.
Figure 3B:
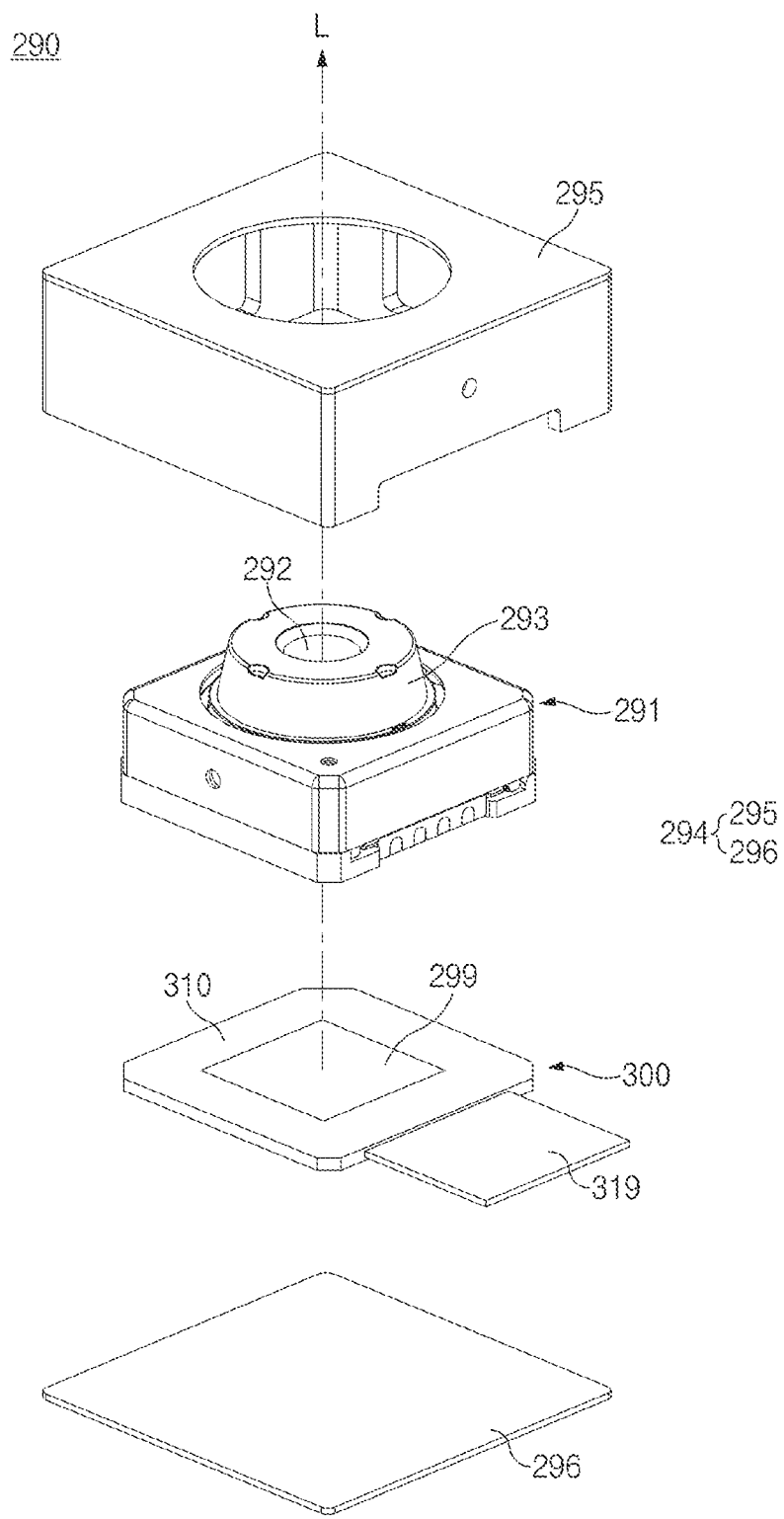
FIG. 3B is an exploded perspective view of the camera module of the electronic device according to various embodiments.

FIG. 3A is a perspective view illustrating an example camera module of the electronic device according to various embodiments. FIG. 3B is an exploded perspective view of the camera module of the electronic device according to various embodiments.

The camera module 290 illustrated in FIGS. 3A and 3B may include the first camera module 290a or the second camera module 290b illustrated in FIG. 2C.

Referring to FIGS. 3A and 3B, the camera module 290 may include a camera housing 294, a body 291, and a PCB structure 300.

In an embodiment, the camera housing 294 may include a base 296 and a cover 295. A circuit board 310 may be disposed on the base 296. The base 296 and the cover 295 may form an interior space in which the body 291 is accommodated. In an embodiment, the body 291 may include a lens 292 and a lens barrel 293 surrounding at least part of the lens 292. At least part of the body 291 may be accommodated in the camera housing 294. For example, part of the lens barrel 293 may extend outside the camera housing 294.

In an embodiment, at least part of the PCB structure 300 may be disposed in the camera housing 294. The PCB structure 300 may include the circuit board 310, an image sensor 299, and an extended area 319.

In an embodiment, the circuit board 310 may be disposed in the camera housing 294. The extended area 319 may extend outside the camera housing 294 from the circuit board 310. In various embodiments, electronic elements including the image sensor 299 may be disposed on the circuit board 310. In various embodiments, at least part of the circuit board 310 may be formed of a rigid circuit board, and another part of the circuit board 310 may be formed of a flexible circuit board. For example, the area where the image sensor 299 is disposed may be formed of a rigid circuit board. In various embodiments, the extended area 319 may extend to a circuit board (e.g., the circuit board 250 of FIG. 2C) that is disposed in the electronic device 200. The extended area 319 may include a wiring structure that electrically connects other electronic elements (e.g., the processor 120 of FIG. 1) of the electronic device 200 and the image sensor 299. In various embodiments, the extended area 319 may include a flexible circuit board.

In an embodiment, the image sensor 299 may be disposed to be aligned with the optical axis L of the lens 292. For example, the image sensor 299 may include a planar area having a normal vector parallel to the optical axis L of the lens 292.

In an embodiment, a partial area of the circuit board 310 on which the image sensor 299 is disposed may be formed of a flat surface, the normal vector of which is parallel to the optical axis L of the lens 292.

Figure 4:
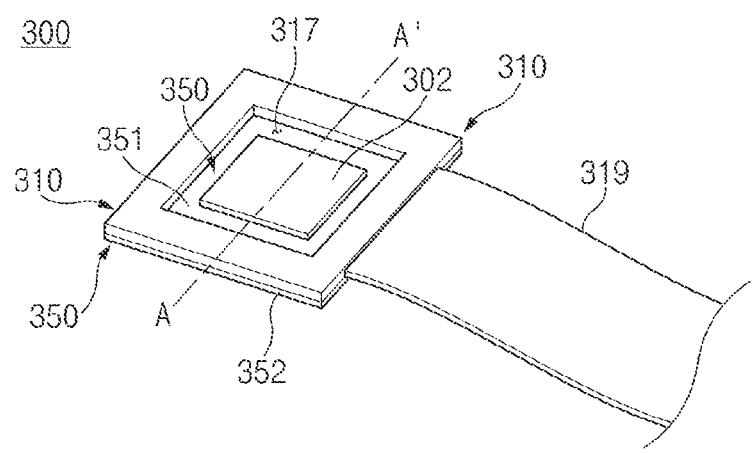
FIG. 4 is a diagram illustrating an example PCB structure of the camera module of the electronic device according to various embodiments.

FIG. 4 is a diagram illustrating an example PCB structure of the camera module of the electronic device according to various embodiments.

The PCB structure 300 illustrated in FIG. 4 may include the circuit board 310 of the camera module 290 illustrated in FIGS. 3A and 3B and the circuit board 250 of the electronic device 200 illustrated in FIG. 2C.

In an embodiment, the PCB structure 300 may include a structure for mounting an electronic element 302 on the circuit board 310. For example, the PCB structure 300 may include the circuit board 310, a plate 350, and the electronic element 302.

In an embodiment, the circuit board 310 may include an opening area 317. The opening area 317 may be formed through a first surface and a second surface of the circuit board 310 that are opposite to each other. In an embodiment, the plate 350 may be disposed on the circuit board 310. For example, the plate 350 may make surface-to-surface contact with the circuit board 310.

In an embodiment, the circuit board 310 may be formed such that the plate 350 is exposed through the opening area 317. In an embodiment, the circuit board 310 may be formed to surround the electronic element 302 disposed on the plate 350.

In an embodiment, the circuit board 310 may further include the extended area 319 that extends to one side. In various embodiments, the extended area 319 may extend to the outside from the inside of the camera housing 294. In various embodiments, the extended area 319 may include a flexible circuit board.

In an embodiment, at least part of the plate 350 may be attached to a surface of the circuit board 310. In an embodiment, the plate 350 may be coupled to the circuit board 310 to cover at least part of the opening area 317 of the circuit board 310. In various embodiments, the plate 350 may contain a metallic material. In various embodiments, the plate 350 may be formed to be more rigid than the circuit board 310.

In an embodiment, the plate 350 may include a first area 351 on which the electronic element 302 is disposed and a second area 352 on which the circuit board 310 is disposed and that surrounds at least part of the first area 351. For example, the first area 351 may form the bottom of the opening area 317 of the circuit board 310.

In an embodiment, the plate 350 may be electrically connected with the electronic element 302. In various embodiments, the electronic element 302 may include an image sensor (e.g., the image sensor 299 of FIG. 3B).

In an embodiment, the plate 350 may be electrically connected with the circuit board 310. For example, the plate 350 may be electrically connected with a conductive pattern (e.g., a conductive pattern 380 of FIG. 5) that is included in the circuit board 310. For example, the second area 352 of the plate 350 may be electrically connected with part of the conductive pattern. In an embodiment, the plate 350 may be attached to the circuit board 310 by a conductive adhesive material. For example, one or more conductive materials may be located between the second area 352 of the plate 350 and the circuit board 310. In an embodiment, the plate 350 may be surface mounted on the circuit board 310. In various embodiments, the second area 352 of the plate 350 may be attached to the surface of the circuit board 310 by soldering.

Figure 5:
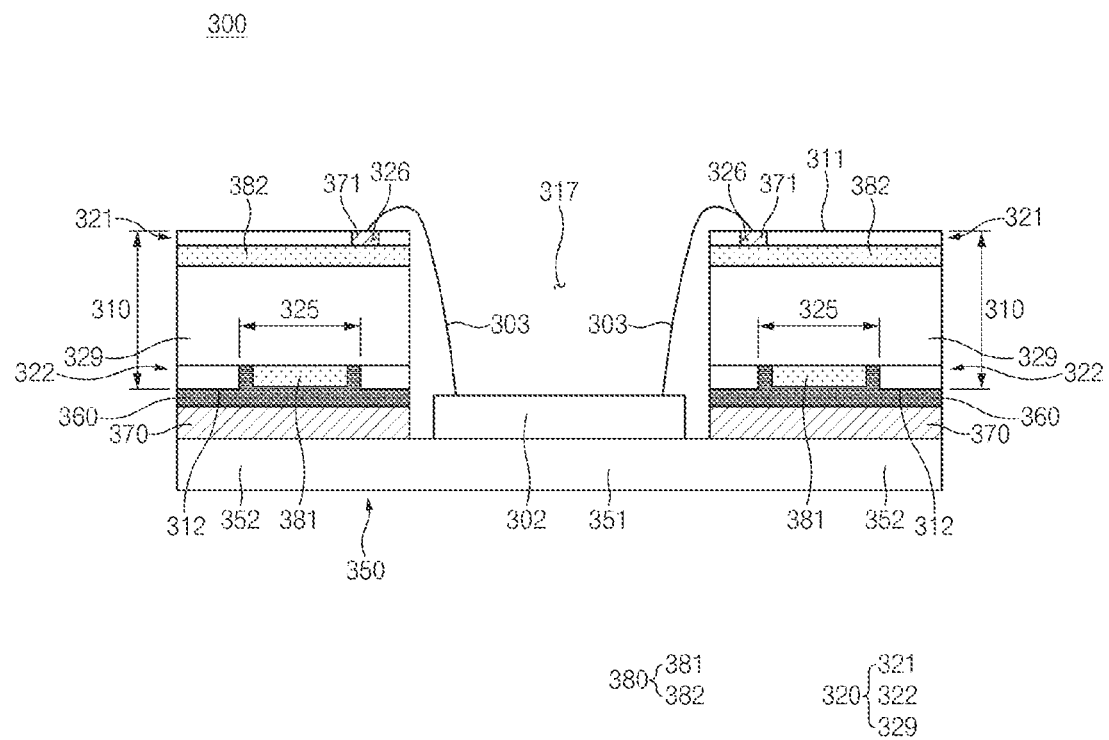
FIG. 5 is a sectional view illustrating the PCB structure of the camera module of the electronic device according to various embodiments.

FIG. 5 is a sectional view illustrating the PCB structure of the camera module of the electronic device according to various embodiments. FIG. 5 is a sectional view taken along line A-A' of FIG. 4.

In an embodiment, the electronic device 200 may include the PCB structure 300 for mounting the electronic element 302. The PCB structure 300 may include the circuit board 310, a resin portion 360, the plate 350, a solder portion 370, and the electronic element 302.

The circuit board 310 illustrated in FIG. 5 may include a circuit board (e.g., the circuit board 310 of FIG. 3B) of a camera module (e.g., the camera module 290 of FIGS. 3A and 3B) on which an image sensor (e.g., the image sensor 299 of FIG. 3B) is mounted. For example, the camera module 290 may include the rear camera module 290*b* visible through a rear surface (e.g., the rear surface 210B of FIG. 2B) of the electronic device 200.

In an embodiment, the circuit board 310 may include a plurality of layers 320 and the opening area 317 formed through the plurality of layers 320. The opening area 317 may be formed through a first surface 311 and a second surface 312 of the circuit board 310 that are opposite to each other.

In an embodiment, the plurality of layers 320 may include a first insulation layer 321, a second insulation layer 322, the conductive pattern 380, and a layer group 329.

In an embodiment, the first insulation layer 321 may form at least part of the first surface 311 of the circuit board 310. The first insulation layer 321 may include a first opening 326 through which a portion (e.g., a second portion 382) of the conductive pattern 380 is exposed. A solder material 371 may be accommodated in the first opening 326.

In an embodiment, the second insulation layer 322 may form at least part of the second surface 312 of the circuit board 310. The second insulation layer 322 may include a second opening 325 through which a portion (e.g., a first portion 381) of the conductive pattern 380 is exposed. The resin portion 360 may be formed in the second opening 325.

In an embodiment, the conductive pattern 380 may include the first portion 381 that makes contact with the resin portion 360. In the illustrated embodiment, the first portion 381 may be exposed on the second surface 312 of the circuit board 310 through the second opening 325 of the second insulation layer 322. In various embodiments, the first portion 381 may be referred to as a conductive pad of the circuit board 310 on which the electronic element 302 is disposed or with which the electronic element 302 is electrically connected.

In an embodiment, the conductive pattern 380 may include the second portion 382 electrically insulated from the first portion 381. In an embodiment, a ground signal may be applied to the first portion 381. In an embodiment, a different electrical signal rather than the ground signal may be applied to the second portion 382. In various embodiments, the second portion 382 of the conductive pattern 380 may be exposed on the first surface 311 of the circuit board 310 through the first opening 326 of the first insulation layer 321. In various embodiments, the solder material 371 electrically connected with the second portion 382 of the conductive pattern 380 may be accommodated in the first opening 326. The solder material 371 may electrically connect the second portion 382 and the electronic element 302. In various embodiments, the second portion 382 may be referred to as a conductive pad of the circuit board 310 on which the electronic element 302 is disposed or with which the electronic element 302 is electrically connected.

In various embodiments, the first portion 381 and the second portion 382 may be conductive patterns formed in different layers among the plurality of layers 320 of the circuit board 310.

In an embodiment, at least part of the resin portion 360 may be accommodated in the second opening 325, and another part of the resin portion 360 may extend along a surface of the second insulation layer 322.

In an embodiment, the resin portion 360 may contain a conductive material. For example, the resin portion 360 may be formed by curing a liquid conductive material applied to the conductive pattern 380. In various embodiments, the conductive material may include a thermosetting resin and a UV curable resin.

In various embodiments, the resin portion 360 may contain a solder paste. In various embodiments, the resin portion 360 may additionally contain metal and/or tin. For example, the resin portion 360 may be plated with metal and/or tin.

In an embodiment, the solder portion 370 may be formed between the resin portion 360 and the plate 350. The solder portion 370 may bond the plate 350 to the resin portion 360. The solder portion 370 may be formed by curing a solder material between the plate 350 and the resin portion 360.

In an embodiment, the plate 350 may be formed to be substantially flat. In an embodiment, the plate 350 may support the electronic element 302 such that the electronic element 302 remains flat. In an embodiment, the plate 350 may prevent and/or reduce warpage of the circuit board 310.

In an embodiment, the electronic element 302 may be disposed on the plate 350. The electronic element 302 may be electrically connected with the circuit board 310. For example, the electronic element 302 may be electrically connected with the first portion 381 and the second portion 382 of the conductive pattern 380 included in the circuit board 310. For example, the electronic element 302 may be electrically connected to the first portion 381 of the conductive pattern 380 through the plate 350 and the resin portion 360. For example, the electronic element 302 may be electrically connected to the second portion 382 of the conductive pattern 380 through a wire 303.

In an embodiment, part of the wire 303 may be soldered to the second portion 382 of the conductive pattern 380 by the solder material 371. In various embodiments, a ground signal may be applied to the first portion 381 of the conductive pattern 380 and the resin portion 360. A different electrical signal rather than the ground signal may be applied to the wire 303 and the second portion 382 of the conductive pattern 380.

In various embodiments (not illustrated), the layer group 329 may include a plurality of conductive layers and a plurality of insulation layers.

Figure 6:
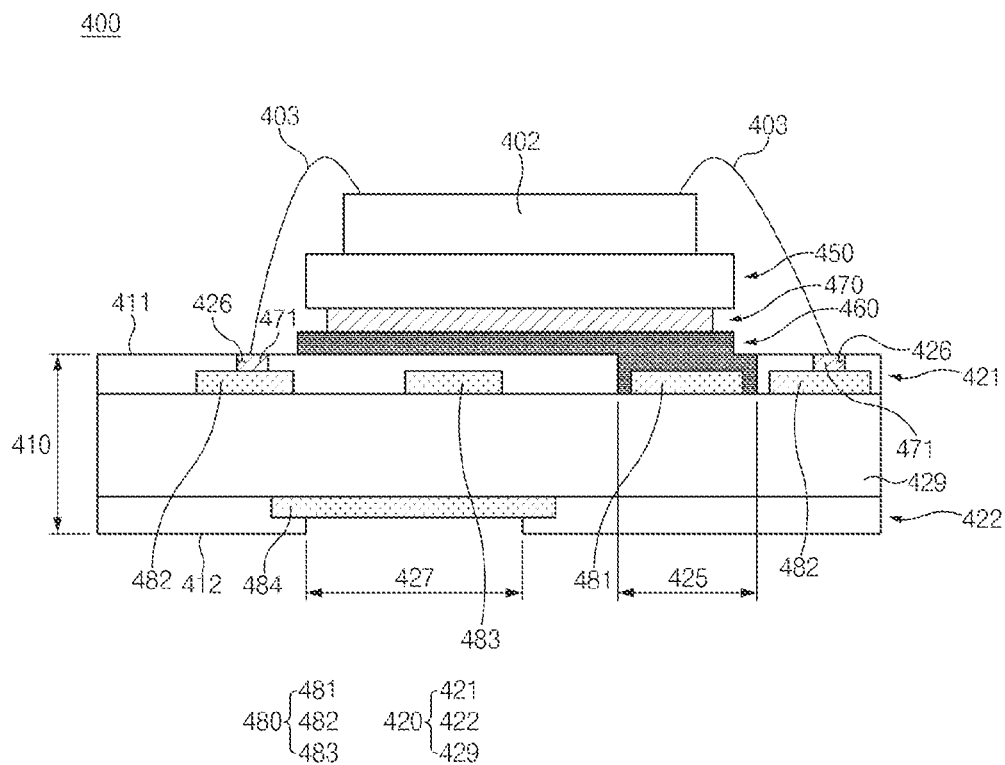
FIG. 6 is a sectional view illustrating a PCB structure of the electronic device according to various embodiments.

FIG. 6 is a sectional view illustrating an example PCB structure of the electronic device according to various embodiments.

A circuit board 410 illustrated in FIG. 6 may include a circuit board (e.g., the circuit board 250 of FIG. 2C) of the electronic device 200 or a circuit board (e.g., the circuit board 310 of FIG. 3B) of a camera module (e.g., the camera module 290 of FIGS. 3A and 3B).

An electronic element 402 illustrated in FIG. 6 may include an image sensor (e.g., the image sensor 299 of FIG. 3B).

In an embodiment, the PCB structure 400 may include the circuit board 410, a resin portion 460 (e.g., the resin portion 360 of FIG. 5), a plate 450 (e.g., the plate 350 of FIG. 5), a solder portion 470 (e.g., the solder portion 370 of FIG. 5), and the electronic element 402 (e.g., the electronic element 302 of FIG. 5).

In an embodiment, the circuit board 410 may include a plurality of layers 420. The plurality of layers 420 may include a first insulation layer 421, a second insulation layer 422, a first conductive pattern 480, a second conductive pattern 484, and a layer group 429.

In an embodiment, the first insulation layer 421 may form a first surface 411 of the circuit board 410. The first insulation layer 421 may include a first opening 425 and a second opening 426 through which a portion of the first conductive pattern 480 is exposed. For example, the resin portion 460 may be formed in the first opening 425. For example, a solder material 471 may be located in the second opening 426. In various embodiments, the first insulation layer 421 may be formed by applying an insulating material such that the insulating material covers at least part of the first conductive pattern 480.

In an embodiment, the first conductive pattern 480 may include a first portion 481 making contact with the resin portion 460, a second portion 482 making contact with the solder material 471, and a third portion 483 covered by the first insulation layer 421. For example, at least two of the first portion 481, the second portion 482, and the third portion 483 may be electrically insulated from each other. In various embodiments, the first portion 481 and the second portion 482 may be referred to as conductive pads of the circuit board 410.

In an embodiment, the plate 450 may be disposed on the first surface 411 of the circuit board 410. In an embodiment, the electronic element 402 may be located on the plate 450. In various embodiments, the plate 450 may support the electronic element 402 such that the electronic element 402 remains flat. In various embodiments, at least part of the resin portion 460 may be disposed between the plate 450 and the circuit board 410.

In an embodiment, the electronic element 402 may be connected with the second portion 482 of the first conductive pattern 480 by wire bonding. For example, one side of a wire 403 may be connected to the electronic element 402, and an opposite side of the wire 403 may be electrically connected with the second portion 482 of the first conductive pattern 480 by soldering.

In an embodiment, at least part of the resin portion 460 may be accommodated in the first opening 425 formed in the first insulation layer 421, and another part of the resin portion 460 may extend along a surface of the first insulation layer 421. In an embodiment, the resin portion 460 may contain a conductive material. In various embodiments, the resin portion 460 may be formed by curing a liquid conductive material with which the first opening 425 is filled and that is applied to the surface of the first insulation layer 421. In various embodiments, the conductive material may include a thermosetting resin and a UV curable resin.

In various embodiments, the plate 450 may be surface mounted on the resin portion 460. For example, the solder portion 470 containing a solder material may be located on one surface of the resin portion 460 that faces the plate 450. In various embodiments, the resin portion 460 may additionally contain a solder paste. For example, the solder paste may contain metal and/or tin. For example, the resin portion 460 may be plated with metal or tin.

In an embodiment, the first portion 481 of the first conductive pattern 480 may be electrically connected with the electronic element 402 through the plate 450 and the resin portion 460. In various embodiments, the first portion 481 of the first conductive pattern 480 may include a ground area.

A different electrical signal rather than a ground signal may be applied to the second portion 482 of the first conductive pattern 480.

In an embodiment, the second insulation layer 422 may form a second surface 412 of the circuit board 410. The second insulation layer 422 may include a third opening 427 through which a portion of the second conductive pattern 484 is exposed. The second insulation layer 422 may be formed by applying an insulating material such that the insulating material covers a portion of the second conductive pattern 484. In various embodiments, the third opening 427 may be referred to as a conductive pad of the circuit board 410.

In various embodiments (not illustrated), the layer group 429 may include a plurality of conductive layers and a plurality of insulation layers.

In various embodiments, the PCB structure 300 illustrated in FIG. 5 may be included in a front camera module (e.g., the first camera module 290a of FIG. 2C). In various embodiments, the PCB structure 400 illustrated in FIG. 6 may be included in a rear camera module (e.g., the second camera module 290b of FIG. 2C).

Referring to the PCB structures 300 and 400 illustrated in FIGS. 5 and 6, when the circuit boards 310 and 410 are viewed from above, the plates 350 and 450 may be located to overlap at least parts of the conductive patterns 380 and 480. For example, when mechanical parts (e.g., the plates 350 and 450) are mounted on the circuit boards 310 and 410 according to the related art, wide pads corresponding to the sizes of the mechanical parts may be required, and therefore the areas of pattern regions (e.g., the regions where the conductive patterns 380 and 480 are formed) may be relatively reduced. However, the PCB structures 300 and 400 according to the embodiments of the disclosure are configured such that mechanical parts (e.g., the plates 350 and 450) and pattern regions (e.g., the conductive patterns 380 and 480) overlap each other. Accordingly, the areas of the circuit boards 310 and 410 may be efficiently used.

An electronic device according to various example embodiments of the disclosure may include a housing and a PCB structure disposed in the housing. The PCB structure may include a circuit board including an opening area formed through a first surface and a second surface of the circuit board, the first and second surface being opposite to each other and a conductive pattern formed in a peripheral area around the opening area, a plate disposed on the second surface of the circuit board and covering the opening area, an electronic element disposed on the plate and electrically connected with the circuit board, a resin portion disposed between the plate and the circuit board extending from the conductive pattern and including a conductive material, and a solder portion formed between the resin portion and the plate.

In various example embodiments, the circuit board may further include an insulation layer covering at least part of the conductive pattern and forming at least part of the second surface of the circuit board. The insulation layer may include a first opening through which a first portion of the conductive pattern is exposed on the second surface of the circuit board. The resin portion may make contact with the first portion of the conductive pattern.

In various example embodiments, at least part of the resin portion may be accommodated in the first opening, and an other part of the resin portion may be formed on the second surface of the circuit board.

In various example embodiments, the conductive material may be configured to be applied in a liquid phase to the inside of the first opening and a surface of the insulation layer and may be cured to form the resin portion.

In various example embodiments, the resin portion may include a thermosetting resin or a UV curable resin.

In various example embodiments, the resin portion may be plated with metal and/or tin.

In various example embodiments, a ground area of the circuit board may include the first portion of the conductive pattern, and the electronic element may be electrically connected to the first portion through the plate.

In various example embodiments, the conductive pattern may include a second portion exposed on the first surface of the circuit board, and the second portion may be electrically connected with the electronic element.

In various example embodiments, the electronic device may further include a wire electrically connecting the electronic element and the second portion of the conductive pattern.

In various example embodiments, an electrical signal other than a ground signal may be applied to the second portion of the conductive pattern.

In various example embodiments, the plate may include a first area contacting the solder portion and a second area at least partially surrounded by the first area, and the electronic element may be disposed on the second area.

In various example embodiments, the first area and the second area may form a same plane.

In various example embodiments, an area of the second surface of the circuit board where the resin portion is formed may have a first height from the plate, and at least part of the electronic element may have a second height from the plate, the second height being substantially the same as the first height.

In various example embodiments, the electronic device may further include a camera module including a lens, and the electronic element may include an image sensor aligned with an optical axis of the lens.

In various example embodiments, the plate may be formed of a flat surface having a normal vector parallel to the optical axis of the lens.

An electronic device according to various example embodiments of the disclosure may include: a housing, a display, a circuit board disposed in the housing and including a conductive pattern and an insulation layer covering part of the conductive pattern and forming a surface of the circuit board, the circuit board having an opening through which a first portion of the conductive pattern is exposed on the surface of the circuit board, a metal plate disposed on the circuit board and electrically connected with the first portion of the conductive pattern, an electronic element disposed on the metal plate, a conductive resin electrically connecting the electronic element and the conductive pattern, and a solder portion electrically connecting the metal plate and the conductive resin. At least part of the conductive resin may be accommodated in the opening, and an other part of the conductive resin may extend along a surface of the insulation layer.

In various example embodiments, the metal plate may be surface mounted on the circuit board by the conductive resin and the solder portion.

In various example embodiments, the conductive resin may include a thermosetting resin and/or a UV curable resin.

In various example embodiments, the conductive pattern may include a second portion electrically insulated from the first portion, and the second portion may be electrically connected with the electronic element by wire bonding.

In various example embodiments, the electronic device may further include a camera module including a lens visible on the first surface of the housing, the circuit board may be included in the camera module, and the electronic element may include an image sensor aligned with an optical axis of the lens.

According to various example embodiments of the disclosure, the degree of flatness of an image sensor may be improved. Furthermore, the utilization of a circuit board may be improved. In addition, the disclosure may provide various effects that are directly or indirectly recognized.

Various embodiments of the disclosure and terms used herein are not intended to limit the technologies described in the disclosure to specific embodiments, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may refer to the device being "capable of" operating together with another device or other parts. For example, a "processor configured to (or set to) perform A, B, and C" may refer, for example, to a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device (e.g., the memory 130).

The term "module" used herein may include a unit, which is implemented with hardware, software, or firmware, or any combination thereof, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media (e.g., the memory 130) in the form of a program module. The instruction, when executed by a processor (e.g., the processor 120), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may include a single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

While the disclosure has been illustrated and described with reference to various example embodiments thereof, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a housing; and
   a printed circuit board (PCB) structure disposed in the housing,
   wherein the PCB structure includes:

a circuit board including an opening area formed through a first surface of the circuit board and a second surface of the circuit board opposite the first surface of the circuit board and a conductive pattern formed in a peripheral area around the opening area, the conductive pattern including a first portion and a second portion;

a plate disposed on the second surface of the circuit board and covering the opening area;

an electronic element disposed on the plate and electrically connected with the circuit board;

a resin portion disposed between the plate and the circuit board, the resin portion extending from the conductive pattern and including a conductive material;

a solder portion formed between the resin portion and the plate;

a first insulation layer covering at least part of the conductive pattern and forming at least part of the first surface of the circuit board, wherein the first insulation layer includes a first opening through which the first portion of the conductive pattern is exposed on the first surface of the circuit board; and a second insulation layer covering at least part of the conductive pattern and forming at least part of the second surface of the circuit board, wherein the second insulation layer includes a second opening through which the second portion of the conductive pattern is exposed on the second surface of the circuit board, wherein the second portion of the conductive pattern is electrically connected with the electronic element, the electronic element is electrically connected to the second portion through the plate and the resin portion, and the first portion of the conductive pattern is electrically insulated from the second portion of the conductive pattern, and wherein at least part of the resin portion is accommodated in the second opening and between an inside surface of the second opening and a side of the first portion of the conductive pattern facing the inside surface of the second opening, and another part of the resin portion extends along a surface of the second insulation layer to be formed on the second surface of the circuit board.

2. The electronic device of claim 1, wherein the resin portion is formed to contact the second portion of the conductive pattern.

3. The electronic device of claim 1, wherein the conductive material is configured to be applied in a liquid phase to the inside of the second opening and a surface of the insulation layer and is curable to form the resin portion.

4. The electronic device of claim 1, wherein the resin portion includes a thermosetting resin or a UV curable resin.

5. The electronic device of claim 1, wherein the resin portion is plated with metal and/or tin.

6. The electronic device of claim 1, wherein a ground area of the circuit board includes the second portion of the conductive pattern.

7. The electronic device of claim 1, further comprising:
a wire electrically connecting the electronic element and the first portion of the conductive pattern.

8. The electronic device of claim 1, wherein the first portion of the conductive pattern is configured to have an electrical signal other than a ground signal applied thereto.

9. The electronic device of claim 1, wherein the plate includes a first area contacting the solder portion and a second area at least partially surrounded by the first area, and wherein the electronic element is disposed on the second area.

10. The electronic device of claim 9, wherein the first area and the second area form a same plane.

11. The electronic device of claim 1, wherein an area of the second surface of the circuit board where the resin portion is formed has a first height from the plate, and
wherein at least part of the electronic element has a second height from the plate, the second height being the same as the first height.

12. The electronic device of claim 1, wherein the electronic device further comprises a camera module including a lens, and
wherein the electronic element includes an image sensor aligned with an optical axis of the lens.

13. The electronic device of claim 12, wherein the plate has a flat surface having a normal vector parallel to the optical axis of the lens.

14. An electronic device comprising:
a housing;
a display;
a circuit board disposed in the housing, the circuit board including a conductive pattern and an insulation layer covering part of the conductive pattern and forming a surface of the circuit board, wherein the circuit board has an opening through which a first portion of the conductive pattern is exposed on the surface of the circuit board and the conductive pattern includes a second portion electrically insulated from the first portion;
a metal plate disposed on the circuit board electrically connected with the first portion of the conductive pattern;
an electronic element disposed on the metal plate;
a conductive resin electrically connecting the electronic element and the conductive pattern; and
a solder portion electrically connecting the metal plate and the conductive resin,
wherein at least part of the conductive resin is accommodated in the opening and between an inside surface of the opening and a side of the first portion of the conductive pattern facing the inside surface of the opening, an other part of the conductive resin extends along a surface of the insulation layer, the second portion is electrically connected with the electronic element by wire bonding, and the first portion and the second portion are provided on a same layer of the circuit board.

15. The electronic device of claim 14, wherein the metal plate is surface mounted on the circuit board by the conductive resin and the solder portion.

16. The electronic device of claim 14, wherein the conductive resin includes a thermosetting resin and/or a UV curable resin.

17. The electronic device of claim 14, wherein the electronic device further comprises a camera module including a lens visible through a first surface of the housing,
wherein the circuit board is included in the camera module, and
wherein the electronic element includes an image sensor aligned with an optical axis of the lens.

* * * * *